United States Patent [19]

Mason

[11] 3,985,590
[45] Oct. 12, 1976

[54] PROCESS FOR FORMING HETEROEPITAXIAL STRUCTURE

[75] Inventor: Donald R. Mason, Indialantic, Fla.

[73] Assignee: Harris Corporation, Cleveland, Ohio

[22] Filed: Dec. 15, 1975

[21] Appl. No.: 641,059

Related U.S. Application Data

[62] Division of Ser. No. 369,422, June 13, 1973, Pat. No. 3,935,040, which is a division of Ser. No. 190,778, Oct. 20, 1971, Pat. No. 3,766,447.

[52] U.S. Cl. .............................. 148/175; 156/612; 357/61
[51] Int. Cl.² ............... H01L 21/205; H01L 31/12; H01L 21/84
[58] Field of Search ................... 148/175; 156/612; 357/16, 17, 19, 49, 50, 61

[56] References Cited

UNITED STATES PATENTS

| 3,275,906 | 9/1966 | Matsukura et al. | 357/16 X |
|---|---|---|---|
| 3,309,553 | 3/1967 | Kroemer | 357/16 X |
| 3,341,376 | 9/1967 | Spenke et al. | 148/175 |
| 3,433,684 | 3/1969 | Zanowick et al. | 357/16 X |
| 3,433,686 | 3/1969 | Marinace | 148/175 |
| 3,473,978 | 11/1969 | Jackson et al. | 148/175 |
| 3,615,855 | 10/1971 | Smith | 136/89 |
| 3,699,401 | 10/1972 | Tietjen et al. | 357/17 X |
| 3,725,749 | 4/1973 | Groves et al. | 357/17 X |

FOREIGN PATENTS OR APPLICATIONS

| 1,242,310 | 8/1971 | United Kingdom | 148/175 |

OTHER PUBLICATIONS

Murray et al. "Lighting up in a Group" Electronics, Mar. 4, 1968, pp. 104–110.

Blum et al., "Vapor Growth of Gap Onto Si Substrates" I.B.M. Tech. Discl. Bull., vol. 13, No. 5, Oct. 1970, p. 1245.

Chang, I. F., "Fet–Bipolar Integration" Ibid., vol. 14, No. 1, June 1971, pp. 350–351.

Burmeister et al., "Epitaxial Growth of $GaAs_{1-x}P_x$ Germanium Substrates" Trans. Metallurgical Soc., Aime, vol. 245, Mar. 1969, pp. 565–569.

Primary Examiner—L. Dewayne Rutledge
Assistant Examiner—W.G. Saba
Attorney, Agent, or Firm—Leitner, Palan & Martin

[57] ABSTRACT

A process for producing light emitting diodes is disclosed. In the process a major planar surface of a single crystal silicon wafer is modified to acceptably match the crystallographic lattice constant of a preselected electroluminescent single crystal semiconductor, such as gallium phosphide. The preselected electroluminescent semiconductor material is then epitaxially deposited in single crystal form on the modified surface of the silicon wafer, a step which is not feasible without the modification of the silicon wafer surface. Preferably, the modification is achieved by epitaxially depositing a thin layer of semiconductor material whose lattice structure offers a substantially smaller disparity with the structure of the electroluminescent material than the existing disparity between the silicon wafer and the electroluminescent material.

14 Claims, 2 Drawing Figures

PROCESS FOR FORMING HETEROEPITAXIAL STRUCTURE

CROSS-REFERENCE TO RELATED APPLICATION

This application is a division of my prior copending application Ser. No. 369,422, filed June 13, 1973, now U.S. Pat. No. 3,935,040, issued Jan. 27, 1976, which is a division of application Ser. No. 190,778, filed Oct. 20, 1971, now U.S. Pat. No. 3,766,447.

BACKGROUND OF THE INVENTION

1. Field

The invention disclosed and claimed herein is in the field of semiconductor devices and processes for their manufacture. Specifically the invention is directed toward the preparation of light emitting diodes (LEDs) and toward the structure of such diodes.

2. Prior Art

The capability of certain semiconductor materials such as gallium phosphide (GaP), gallium arsenide (GaAs), and gallium arsenide phosphide (GaAsP), when in p-n junction configuration, to emit visible light in certain regions of the spectrum at extremely low power dissipation levels would seemingly make these materials prime candidates for use in the production of solid state displays. However, pure electroluminescent materials of this type are expensive, being difficult and costly to produce in large single crystals which heretofore have been required for display devices, and therefore solid state displays consisting of these materials have found only limited use, existing principally as laboratory curiosities. Typically GaP and GaAs single crystals are grown in relatively small diameter form by the Bridgeman or Czochralski method, the crystals are thereafter sawed into wafers, and the same material of which the crystals is composed is ultimately epitaxially deposited in appropriately doped form and desired pattern on the wafer to provide a monolithic array of light emitting diodes.

Manifestly, it would be desirable to provide monolithic displays capable of functioning in an identical manner to those described above, but without need for the costly basic materials heretofore employed. It is the principal objective of the present invention to provide low cost monolithic semiconductor light emitting displays and processes for making such displays.

SUMMARY OF THE INVENTION

The crux of the invention is the epitaxial deposition of known electroluminescent semiconductor materials, such as GaP, GaAs, and GaAsP on substrates of different, less expensive crystalline materials. Preferably, substrates of single crystal silicon are used because the latter is comparatively less expensive than single crystal GaP, GaAs, or GaAsP, by a sufficiently large margin to justify widespread commercial use of LEDs, and because single crystal silicon is compatible with fabrication techniques for most present-day semiconductor devices, being the basic material for those devices. Despite the desirability of silicon there is nothing critical about its use as the substrate material, and it is contemplated that other materials of equal or lesser cost such as germanium, sapphire or spinel may be preferred for a specific application. Regardless of the material used for the substrate, however, if it differs from the material to be epitaxially deposited thereon there will usually be a considerable difference in the lattice constant of the two materials. By "considerable" is meant a lattice mismatch sufficiently great to preclude true epitaxial growth, in the sense of extension of the crystal lattice structure, of one material upon the other. Clearly, the resulting layer of electroluminescent material would be polycrystalline rather than monocrystalline in form, and hence would be unsuitable as an efficient light emitting diode structure.

According to an important aspect of the invention, then, the lattice constants of the substrate and the electroluminescent layers are artificially "matched", where necessary, by use of an intermediate layer or region between the two which is compatible with both. In the particular case of Si and GaP, for example, the lattice constant of Si is approximately 5.42 and that of GaP is approximately 5.45. The lattice mismatch is $(5.45 - 5.42)/5.42 \times 100 = 0.56\%$, which is unacceptable for producing a heteroepitaxial structure. The angle of mismatch between the substrate and the epitaxial film, in this case is:

$$\theta = \cos^{-1}(5.42/5.45) = \cos^{-1} 0.995 = 5°40'.$$

Such a mismatch angle is too large for normal epitaxy. In a preferred embodiment of the invention the mismatch between Si and GaP is compensated by the use between the two of a graded alloy layer consisting of Si with a germanium (Ge) concentration ranging from zero at the junction with the Si substrate to about eight percent at the junction with the GaP layer. Here again, alternatives are available. Clearly, factors such as a reasonably close match between the thermal coefficients of linear expansion of the various layers, must be considered for any given case.

DESCRIPTION OF THE PREFERRED EMBODIMENT

Figure 1:
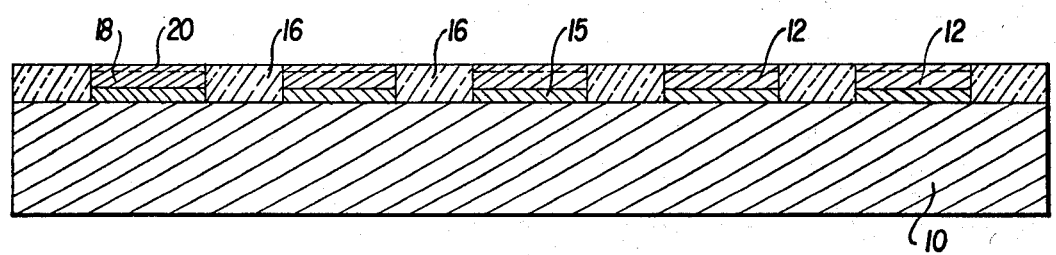
FIG. 1 is a cross-section of a monolithic heteroepitaxial LED array.

According to a preferred method of practicing the invention, a large diameter single crystal silicon wafer is used as the substrate. One or both major faces of the wafer are polished using standard techniques.

After polishing, the wafer is masked, as by oxidation, to form a silicon oxide film on an exposed major surface. The desired light emitting diode pattern may then be provided in the mask using conventional protoresist and etch techniques. For example, an alphanumeric display consisting of a $5 \times 7$ dot matrix is conveniently formed by opening five columns and seven rows of apertures in the oxide mask layer. Of course, other LED pattern geometries and other dielectric or insulative layers (such as silicon oxynitride or silicon nitride) may be employed in the masking process.

A silicon-germanium (Si-Ge) alloy layer is now formed in each aperture on the major face of the Si wafer. This is one of the critical steps of the process in that the alloy or other intermediate material must be capable of forming a suitable junction between the substrate and the electroluminescent material, and must have a crystal lattice constant at its surface matching the lattice constant of the electroluminescent material. While Si-Ge alloy is preferred at this time, other materials may provide similar or perhaps even better results, and therefore the invention should not be considered as limited to any particular intermediate junction layer. The Si-Ge alloy is epitaxially deposited in a manner such that the initial coating on the silicon wafer face is substantially pure single crystal silicon and the germanium concentration is thereafter gradually increased from zero percent to about eight percent over a layer thickness of a few microns. This may be accomplished by vapor phase deposition, with hydrogen reduction of silicon tetrachloride (i.e., $SiCl_4$ in $H_2$) at about 1200°C, adding germanium tetrachloride ($GeCl_4$) in gradually increasing amounts to produce the uniformly increasing concentration of Ge throughout the thickness of the Si-Ge alloy layer.

Rather than using hydrogen reduction of silicon tetrachloride, the epitaxial growth may be accomplished by thermal decomposition of silane ($SiH_4$) at a somewhat lower temperature (about 1000°C), or by using $SiHCl_3$ with $GeCl_4$ added during the reaction process in amounts suitable to produce the graded junction (preferably uniformly varying concentration of Ge) Si-Ge alloy layer. Methods of epitaxial deposition of silicon and Si-X alloys are generally well known, and therefore the invention contemplates the use of any available process for accomplishing that result, without limitation.

Although a grading layer is preferred, as an alternative the Si-Ge alloy layer may simply contain a fixed low percentage of germanium, four to ten percent for example, in substantially uniform concentration throughout. In principle, neither the graded nor the uniformly low concentration alloy layer constitutes a step junction with the silicon wafer, nor between the single crystal silicon and the electroluminescent material ultimately deposited on the alloy layer. Instead, each may be validly considered as a linearly graded junction by which an apropriate match is provided between the lattice constant of the silicon wafer and the lattice constant of the electroluminescent layer.

In the formation of the Si-Ge alloy layer, the Si-Ge material deposits epitaxially in single crystal structure on the single crystal silicon wafer surface exposed in the mask apertures, and in polycrystalline structure on the oxide mask covering the remaining portions of the wafer surface. The polycrystalline material may be removed, by lapping, etching, or other conventional steps, before further processing, or it may be retained until additional steps of the overall process are completed. In any event, the desired electroluminescent layer may now be deposited epitaxially on the single crystal alloy layer since the latter provices a surface lattice constant matching the lattice constant of GaP.

GaP doped with Zn, O, and Te is epitaxially deposited as compensated p-type GaP, using separate vapors of elemental Ga in $PCl_3$, Zn, $H_2O$, and $H_2Te$, in the appropriate vapor phase concentrations to produce the single crystal GaP with the desired net doping. The $PCl_3$, $H_2O$ and $H_2Te$ are introduced into separate inlets of a mixing chamber at desired flow rates. The outlet of the mixing chamber is connected to the inlet of a reaction chamber containing hyperpure gallium and into which is also fed the zinc vapor of ultra high purity. Hydrogen may be used as the carrier gas. The reaction zone temperature is preferably maintained in the range from 750°C to 950°C, and the substrate (the silicon wafer with Si-Ge alloy layer deposited thereon in the mask apertures) is maintained at a temperature of from 650°C to 850°C. An epitaxial layer of GaP about 10 to 30 microns thick is grown on the single crystal Si-Ge alloy in the mask apertures to form the light emitting diode array. The formation of a p-n junction necessary for diode action in the GaP layer is conveniently achieved by heating the structure to a temperature in the range from 900°C to 1000°C to induce out-diffusion of zinc ions from the surface of the GaP epitaxial layer, thereby producing an n-type surface region on the p-type material.

An array of LEDs in a monolithic display produced by the above process is shown in FIG. 1. The substrate comprises an appropriately doped single crystal silicon body 10 (here p-type, for example) constituting one of the dice of the original silicon wafer after processing. The electroluminescent areas of GaP are layers 12 separated from silicon body 10 by intermediate lattice constant matching layers 15. Each of the latter is a graded layer of silicon-germanium alloy (here doped p-type for example) in which the germanium concentration increases to a percentage of under ten percent, in the manner described above. Layers 12 are separated from each other by insulative or dielectric passivating regions 16 atop silicon body 10. Usually, these passivating regions comprise silicon dioxide. Each of the electroluminescent layers constitutes a separate and distinct light emitting diode with a shallow p-n junction between p-region 18 (in this example) and n-region 20. The thickness of the various layers and regions are intentionally exaggerated in FIG. 1 for the sake of clarity. Metallization patterns (not shown) for interconnecting the diodes with appropriate drive and-/or decode circuitry may be laid down as an adherent aluminum film on the structure, which may also include an additional passivation layer. Obviously, in any desired arrangement at least a substantial portion of the electroluminescent material is left exposed to exhibit emission of light when energized.

Figure 2:
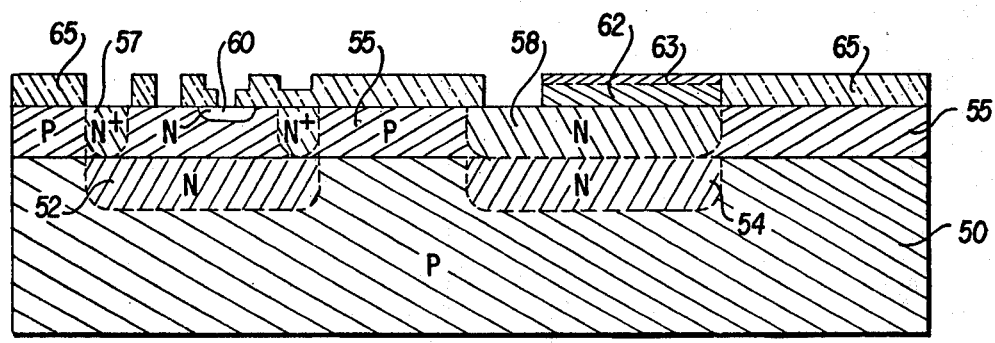
FIG. 2 is a cross-section of a heteroepitaxial LED in integrated circuit with a bipolar transistor.

The silicon body and/or the silicon-germanium layer may contain active or passive components formed therein using conventional techniques, to provide an integrated circuit. A portion of such an integrated circuit is shown in FIG. 2. In the formation of this structure a p-type single crystal silicon substrate 50, after polishing of one or both its major faces, is subjected to oxidation to form an oxide layer mask thereon. Apertures are opened in the mask by standard photoresist-etch techniques, as required for the provision of active components (such as transistors), passive components, and alphanumeric character elements (i.e., LEDs). In the device shown in FIG. 2, diffusion of n-type impurities is employed to form the transistor collector region 52 and the character "tub" 54. After an oxide strip and clean operation, the lattice constant matching layer 55 consisting of p-type Si-Ge of the uniformly graded type as described above is epitaxially deposited on the surface of silicon body 50. The entire body is again subjected to oxidation and opening of apertures in the oxide mask for $n^+$ diffusion to form isolation (p-n junction isolation) ring 57 and additional character tub 58. Another further masking the transistor emitter region 60 is formed by another $n^+$ diffusion into layer 55.

The surface is again masked and LED matrix apertures are opening for epitaxial deposition of n-type GaP layer 62 onto Si-Ge layer 55 via the apertures. A p-type surface diffusion into layer 62 provides a p-region 63 for creating the desired p-n junction for diode action. Finally, a protective coating 65 is deposited on the device and apertures are opened for application of contacts and interconnection through a metallization layer.

Again, while the use of a single crystal semiconductor as the substrate is preferred, to allow incorporation of components of the drive and decode circuit in monolithic form, other single crystal materials such as sapphire or spinel may alternatively be employed as the substrate.

What is claimed is:

1. A process for preparing a single crystal silicon substrate for the production of light emitting diodes comprising:
    epitaxially depositing a thin layer of single crystal silicon-germanium semiconductor material on a major surface of said substrate to form a graded layer having a crystal lattice constant determined by a substantially zero germanium concentration for substantially matching the crystal lattice constant of said substrate at the boundary therebetween and having a crystal lattice constant determined by the maximum germanium concentration for substantially matching the crystal lattice constant of a preselected electroluminescent single crystal semiconductor material at a second surface; and
    epitaxially depositing said preselected electroluminescent semiconductor material in single crystal form on said second surface of said graded layer.

2. The process according to claim 1 wherein said thin layer is an alloy of silicon and germanium wherein the germanium concentration of said silicon-germanium alloy is zero at said major surface of said substrate and under 10 mole percent at said second surface.

3. The process according to claim 1, wherein
    said electroluminescent semiconductor material is selected from the group consisting of GaP, GaAs, and GaAsP.

4. A method of preparing a single crystal silicon substrate for fabrication of a monolithic semiconductor display comprising:
    epitaxially depositing on a plurality of selected regions of a surface of said silicon substrate a thin layer of a silicon-germanium alloy to form a graded layer on each selected region having a crystal lattice constant determined by a substantially zero germanium concentration for substantially matching the crystal lattice constant of said silicon substrate at the boundary therebetween and having a crystal lattice constant determined by the maximum germanium concentration for substantially matching the crystal lattice constant of a preselected electroluminescent single crystal semiconductor material at a asecond surface; and
    thereafter epitaxially depositing a layer of said preselected electroluminescent semiconductor material on each of said thin layers.

5. The method according to claim 4, wherein
    said layer of electroluminescent material is selected from the group consisting of GaP, GaAs, and GaAsP.

6. The method of claim 4 wherein said silicon germanium alloy has a maximum germanium concentration under 10 mole percent.

7. The method according to claim 6, wherein said silicon-germanium alloy has a concentration of germanium that increases from zero to 8 percent from said silicon substrate surface to said second surface.

8. The method according to claim 7, wherein said electroluminescent semiconductor material is a Group III-V compound.

9. A process for producing light emitting diodes on a single crystal silicon substrate comprising:
    epitaxially depositing a thin layer of single crystal silicon-germanium semiconductor material on a major surface of said silicon substrate to form a graded layer having a crystal lattice constant determined by a substantially zero germanium concentration for substantially matching the crystal lattice constant of said silicon substrate at the boundary therebetween and having a crystal lattice constant determined by the maximum germanium concentration for substantially matching the crystal lattice constant of a preselected electroluminescent single crystal semiconductor material at a second surface;
    epitaxially depositing said preselected electroluminescent semiconductor material in single crystal form on said second surface of said graded layer; and
    forming a p-n junction in said deposited electroluminescent semiconductor material for operation as a light emitting diode.

10. The process of claim 9 wherein said electroluminescent semiconductor material is a Group III-V compound.

11. The process of claim 9 wherein said thin layer has a maximum germanium concentration of under 10 mole percent.

12. A method of fabricating a monolithic semiconductor display in a single crystal silicon substrate comprising:
    epitaxially depositing on a plurality of selected regions of a surface of said silicon substrate a thin layer of a silicon-germanium alloy to form a graded layer on each selected region having a substantially zero germanium concentration at the boundary with the silicon substrate and having the maximum germanium concentration at a second surface to provide a crystal lattice constant substantially matching the crystal lattice constant of a preselected electroluminescent single crystal semiconductor material at said second surface;
    thereafter epitaxially depositing a layer of said preselected electroluminescent semiconductor material on each of said thin layers; and
    forming a planar p-n junction in each of said layers of electroluminescent semiconductor material to form a plurality of light emitting diodes for said display.

13. The method of claim 12 wherein said electroluminescent semiconductor material is selected from the group consisting of GaP, GaAs, and GaAsP.

14. The method of claim 12 wherein said thin layer has a maximum germanium concentration of under 10 mole percent.

* * * * *